United States Patent
Fornara et al.

(10) Patent No.: US 11,329,011 B2
(45) Date of Patent: May 10, 2022

(54) METHOD FOR PROTECTING AN INTEGRATED CIRCUIT, AND CORRESPONDING DEVICE

(71) Applicant: STMicroelectronics (Rousset) SAS, Rousset (FR)

(72) Inventors: Pascal Fornara, Pourrieres (FR); Fabrice Marinet, Chateauneuf le Rouge (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/113,645

(22) Filed: Dec. 7, 2020

(65) Prior Publication Data
US 2021/0091015 A1  Mar. 25, 2021

Related U.S. Application Data

(63) Continuation of application No. 16/518,755, filed on Jul. 22, 2019, now Pat. No. 10,886,240.

(30) Foreign Application Priority Data

Jul. 25, 2018  (FR) ...................................... 1856886

(51) Int. Cl.
*H01L 23/00* (2006.01)
*H01L 23/522* (2006.01)
(Continued)

(52) U.S. Cl.
CPC .......... *H01L 23/576* (2013.01); *H01L 23/528* (2013.01); *H01L 23/5226* (2013.01); *H01L 23/585* (2013.01); *H01L 29/8605* (2013.01)

(58) Field of Classification Search
CPC . H01L 23/576; H01L 29/8605; H01L 23/585; H01L 23/528; H01L 23/5226;
(Continued)

(56) References Cited

U.S. PATENT DOCUMENTS 6,856,581 B1  2/2005  Berstis et al.
8,022,460 B2  9/2011  Yamazaki et al.
(Continued)

FOREIGN PATENT DOCUMENTS

EP  1293988 A2  3/2003
EP  1400887 A1  3/2004
(Continued)

OTHER PUBLICATIONS

INPI Search Report and Written Opinion for FR 1856886 dated Mar. 29, 2019 (11 pages).

*Primary Examiner* — Jung Kim
(74) *Attorney, Agent, or Firm* — Crowe & Dunlevy (57) ABSTRACT

An integrated circuit is protected against at attack. An electrically conductive body at floating potential is situated in the integrated circuit. The electrically conductive body has an initial amount of electric charge prior to the attack and functions to collect electric charge as a result of the attack. A detection circuit operates to detect an amount of electric charge collected on the electrically conductive body and determine whether the collected amount is different from the initial amount. If the detected amount of charge is different from the initial amount, a control circuit trigger the taking of a protective action.

17 Claims, 5 Drawing Sheets

(51) Int. Cl.
*H01L 23/528* (2006.01)
*H01L 23/58* (2006.01)
*H01L 29/8605* (2006.01)

(58) Field of Classification Search
CPC ..... H01L 23/573; H01L 23/57; H03H 11/245;
G06K 19/07381; G06K 19/07372
See application file for complete search history.

(56) References Cited

U.S. PATENT DOCUMENTS

| | | |
|---|---|---|
| 8,304,313 B2 | 11/2012 | Tanaka et al. |
| 8,378,710 B1 | 2/2013 | Al-Kadi et al. |
| 8,729,668 B2 | 5/2014 | Fornara et al. |
| 9,025,373 B2 | 5/2015 | Tatsumura et al. |
| 2005/0104161 A1 | 5/2005 | Matsuno |
| 2005/0201158 A1 | 9/2005 | Rosa |
| 2006/0028340 A1 | 2/2006 | Hooghan et al. |
| 2006/0090211 A1 | 4/2006 | Stidl et al. |
| 2013/0032926 A1 | 2/2013 | Fornara et al. |
| 2013/0134499 A1 | 5/2013 | Tatsumura et al. |
| 2013/0193437 A1 | 8/2013 | Lisart et al. |
| 2013/0314121 A1 | 11/2013 | Mougin et al. |
| 2014/0375303 A1 | 12/2014 | Helfmeier et al. |
| 2016/0042199 A1 | 2/2016 | Joharapurkar et al. |
| 2016/0328578 A1 | 11/2016 | Plusquellic et al. |
| 2020/0035624 A1 | 1/2020 | Marinet et al. |

FOREIGN PATENT DOCUMENTS

| | | |
|---|---|---|
| EP | 2680184 A1 | 1/2014 |
| FR | 2938953 A1 | 5/2010 |
| FR | 2985059 A1 | 6/2013 |

METHOD FOR PROTECTING AN INTEGRATED CIRCUIT, AND CORRESPONDING DEVICE

PRIORITY CLAIM

This application is a continuation of U.S. patent application Ser. No. 16/518,755 filed Jul. 22, 2019, now U.S. Pat. No. 10,886,240, which claims the priority benefit of French Application for Patent No. 1856886, filed on Jul. 25, 2018, the contents of which are hereby incorporated by reference in their entireties to the maximum extent allowable by law.

TECHNICAL FIELD

Embodiments and modes of implementation relate to integrated circuits, in particular to the protection thereof and more particularly to the detection of a potential attempt to breach the integrity of the integrated circuit, for example through an attack by means of a projected beam of electrically charged particles.

The projected particles may be positively charged, such as positive ions in the case of a focused ion beam (FIB) or negatively charged, such as electrons in the context of scanning electron microscopy (SEM).

BACKGROUND

Integrated circuits, in particular those equipped with memories containing sensitive information, have to be protected to the greatest possible extent against an attack, in particular an attack intended to uncover stored data.

Among the possible attacks for extracting confidential data from a memory of an integrated circuit, for example a protected memory of a chip card, mention may be made of attacks said to be performed by locally modifying the circuit by means of a focused ion beam.

These attacks may be performed, for example, using focused electron beams (FIB).

Some solutions make it possible to detect the opening of the integrated circuit based on variations in transistor leakage currents. However, this type of solution is difficult to implement.

There is therefore a need to provide a new method for protecting integrated circuits, especially from this type of attack.

SUMMARY

According to modes of implementation and embodiments, it is proposed to meet this need by means of a solution that is easy to implement and based in particular on variations in resistance, making it possible to avoid any ambiguity.

According to one aspect, what is proposed is a method for protecting an integrated circuit, comprising producing, in the integrated circuit, an electrically conductive body at floating potential having an initial amount of electric charge, detecting an amount of electric charge on said body, and executing a protective action if the detected amount of charge is different from the initial amount.

An electrically conductive body at floating potential makes it possible to recover electric charge during an attack, for example with electron beams, and therefore the breach of the integrity of the integrated circuit by detecting an amount of electric charge on said body, in comparison with an initial state of charge of said body.

Although the initial charge state may take any value, it is simpler for the initial amount of charge to be zero.

To this end, according to one mode of implementation, the production of the body at floating potential comprises grounding said body via a connecting element during the production of the integrated circuit then cutting through the connecting element so as to confer a zero initial amount of charge on said body.

The body at floating potential is thus grounded during the production of the integrated circuit in order to shed charge and to provide it with a discharged initial state before any potential attack.

According to one mode of implementation, the method comprises electrically conductively coupling a control terminal of a variable resistor to said body, said resistor being configured so as to have its resistance modified according to the voltage applied to said control terminal and resulting from said amount of charge, and the detection of said amount of charge comprises detecting a physical variable linked to the resistance of the variable resistor.

If a voltage is applied to the control terminal of the variable resistor that results from an accumulation of charge on said body, the value of the resistor is modified. Thus, to detect said accumulation, it is advantageous to measure a physical variable, such as a voltage or a current at the terminals of said resistor, which will be representative of the amount of charge received.

According to one mode of implementation, said protective action is performed if the value of the physical variable linked to the resistance of the variable resistor lies, for example, outside of a range of reference values.

According to another possible mode of implementation, the method comprises electrically conductively coupling a control electrode of an NMOS transistor to said body, said transistor being configured so as to be in an off state when said initial amount of charge is present and in an on state when a voltage induced by an amount of detected positive charge is present.

If the attacker uses a positive ion beam, for example, the voltage on the gate of the transistor increases and the gate-source voltage becomes greater than the threshold voltage of the transistor. The transistor changes to the on state.

As a variant, the method may comprise electrically conductively coupling a control terminal of a variable resistor of a module to said body, wherein the detection of said amount of charge comprises applying a voltage to said control terminal, and the execution of said protective action may comprise modifying a function of said module.

In other words, said variable resistor may also be implemented in a module that has a determined function, for example a filtering function. Thus, when a voltage is applied to the control terminal, since the resistance of the variable resistor is modified, the function of said module is also modified (modification of the cut-off frequency of the filter for example), leading to malfunctioning of the integrated circuit. A countermeasure against said attack is thus created.

As a variant, when a control electrode of an NMOS transistor of a module is electrically conductively coupled to said body, wherein the detection of said amount of positive charge comprises applying a voltage to said control electrode, and the execution of said protective action may also comprise modifying a function of said module resulting from the changing of the transistor to its on state.

Said transistor may also be implemented in parallel on a component of said module that has a determined function. Thus, when a voltage is applied to said control electrode, the transistor changes to the on state and short-circuits the component. The function of said module is therefore modified, leading for example to malfunctioning of said integrated circuit.

According to one mode of implementation, the method may also comprise electrically conductively coupling a terminal of a capacitor to said body, and detecting grounding of said body, comprising detecting, at said terminal, a physical variable whose value is situated outside of a range of reference values.

This advantageously makes it possible to detect whether, in an FIB attack for example, the attacker grounds the body in order to avoid the detection of the accumulation of charge on the body.

In other words, it is also possible to detect manipulation on said body in an attack and generate, for example, an alarm signal, making it possible for example to trigger a protective action.

According to another aspect, what is also proposed is an integrated circuit comprising a circuit configured to protect said integrated circuit, including an electrically conductive body at floating potential situated in the integrated circuit and having an initial amount of electric charge, a detection circuit configured so as to detect an amount of electric charge on said body that is different from the initial amount of charge, and a control circuit configured so as to trigger a protective action if the detected amount of charge is different from the initial amount.

According to one embodiment, the body is configured so as to hold a zero initial amount of charge.

According to one embodiment, the integrated circuit comprises an electrically conductive connecting element having a first end that is connected to said body and a second, free end that is situated outside the integrated circuit.

According to one embodiment, the integrated circuit comprises at least one sealing ring, and said connecting element passes through said at least one sealing ring, the free end of the connecting element being situated outside said at least one sealing ring.

According to one embodiment, the detection circuit comprises: a variable resistor having a control terminal that is electrically coupled to said body, said resistor being configured so as to have its resistance modified according to the voltage that is applied to said control terminal and resulting from said amount of charge, and a detection block configured so as to detect a physical variable linked to the resistance of the variable resistor.

According to one embodiment, the control circuit is configured so as to trigger the protective action if the value of the physical variable linked to the resistance of the variable resistor lies for example outside of a range of reference values.

According to one embodiment, the detection circuit comprises: an NMOS transistor having a control electrode that is electrically coupled to said body, said transistor being configured so as to be in an off state when said initial amount of charge is present and so as to be in an on state when a voltage induced by an amount of detected positive charge is present, and a detection block configured so as to detect said on state of the transistor.

According to one embodiment, the integrated circuit comprises a module including a variable resistor having a control terminal that is electrically coupled to said body, and the detection circuit is configured so as to apply a voltage to said control terminal according to the amount of charge present on said body, and the control circuit is configured so as to trigger the protective action by modifying a function of said module.

According to one embodiment, the integrated circuit comprises a module including an NMOS transistor having a control electrode that is electrically coupled to said body, and the detection circuit is configured so as to apply a voltage to said control electrode when positive charge is present, so as to put the transistor into the on state, and the control circuit is configured so as to trigger the protective action by modifying a function of said module resulting from the changing of the transistor to its on state.

According to one embodiment, the integrated circuit comprises a capacitor having a terminal that is electrically coupled to said body, and the detection circuit is configured so as to detect grounding of said body by performing a measurement, at said terminal, of a physical variable whose value lies outside of a range of reference values.

According to one embodiment, the body comprises an electrically conductive wafer.

The electrically conductive wafer allows a larger area to be occupied and electron beams to be received at multiple sites, and thus makes it possible to detect them better.

What is also proposed is an electronic device, such as a chip card, including an integrated circuit such as described above.

BRIEF DESCRIPTION OF THE DRAWINGS

Other advantages and features of the invention will become apparent upon examining the detailed description of completely non-limiting embodiments and implementations of the invention and the appended drawings, in which.

DETAILED DESCRIPTION

Figure 1A:
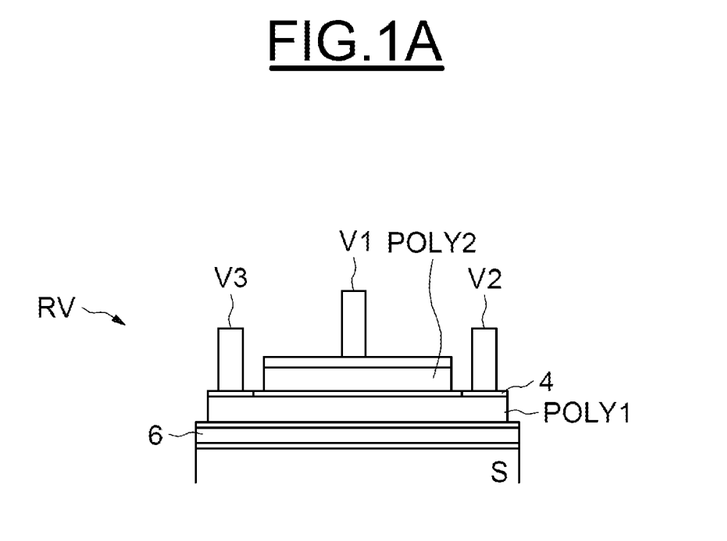
FIG. 1A shows an integrated variable resistor.

FIG. 1A shows an integrated variable resistor RV formed on an insulating layer 6, for example a silicon oxide layer or an oxide-nitride-oxide layer, known to those skilled in the art and the acronym ONO, situated above a substrate S. A resistor of this type is described in U.S. Pat. No. 8,729,668, incorporated by reference. A reminder of some features thereof is given here.

A first polycrystalline silicon layer POLY1 is covered with a stack of insulating layers 4, for example silicon oxide layers or an oxide-nitride-oxide layer. The stack of insulating layers 4 is covered with a second polycrystalline silicon layer POLY2. The first polycrystalline silicon layer POLY1 is highly N-doped, for example with a concentration of dopant elements of the order of $5 \times 10^{18}$ to $5 \times 10^{19}$ atoms/cm$^3$. The thickness of the first polycrystalline silicon layer POLY1 is, for example, between 50 and 150 nm, for example of the order of 90 nm, and the thickness of the second polycrystalline silicon layer POLY2 is, for example, between 150 and 250 nm, for example of the order of 190 nm.

On each side of the stack of said insulating layers 4 and at a distance therefrom, two conductive vias V2 and V3 make it possible to access the terminals of the resistor on the first polycrystalline silicon layer POLY1. Another via V1, forming a control terminal V1, makes it possible to access a contact point on the second polycrystalline silicon layer POLY2. The control terminal V1 makes it possible to apply a voltage to the second polycrystalline silicon layer POLY2.

If a voltage is applied to the second polycrystalline silicon layer POLY2 by the control terminal V1, the resistance of the first polycrystalline silicon layer POLY1 between the terminals V2 and V3 is modified.

Figure 1B:
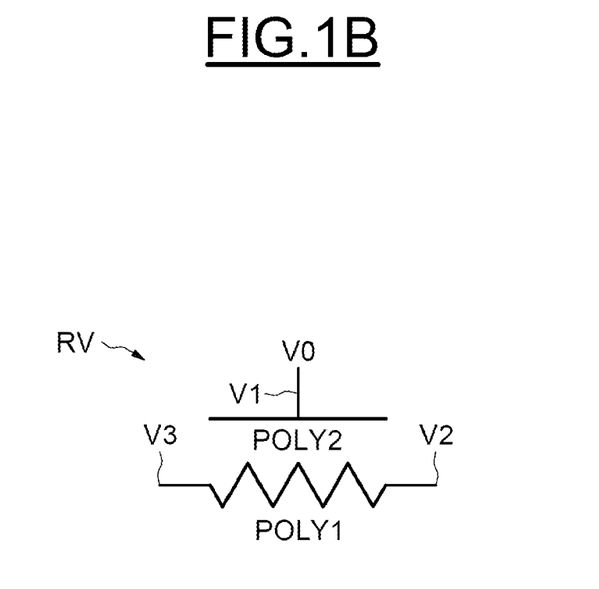
FIG. 1B shows the variable resistor in a simplified and functional manner.

FIG. 1B shows the variable resistor RV in a simplified and functional manner. The first polycrystalline silicon layer POLY1 is shown in the form of a resistor between the terminals V2 and V3. The second polycrystalline silicon layer POLY2 comprises the control terminal V1, by way of which a voltage V0 is applied.

Figure 2:
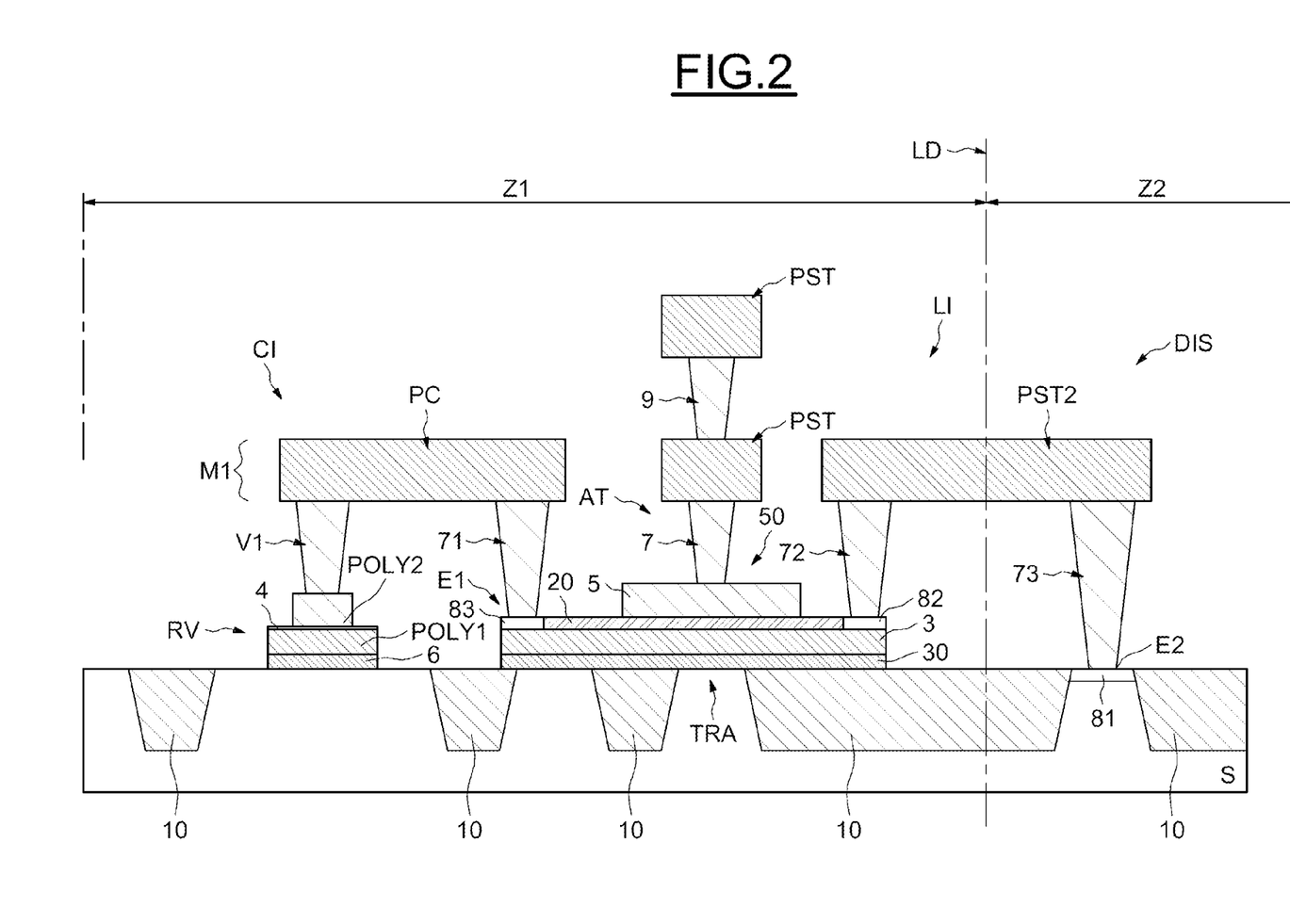
FIG. 2 shows an example of an integrated circuit.

FIG. 2 shows an example of an integrated circuit CI that is situated in a first zone Z1 of a semiconductor wafer and is separated from a second zone Z2 of the wafer by a cutting path LD.

The substrate S of the wafer and of the integrated circuit comprises isolating regions 10, for example shallow trench isolations (STI), or a local oxide (LOCOS for local oxidation of silicon).

The circuit CI comprises, on its outer periphery, a sealing ring AT. This structure is advantageous because it makes it possible to provide sealtightness and therefore to protect integrated circuit CI from the potential propagation of chips and splinters when cutting the wafer to allow the integrated circuits to be singulated.

Of course, the integrated circuit CI may comprise several sealing rings AT on its periphery, these being positioned side-by-side so as to bolster sealtightness and thus better protect the integrated circuit CI.

The sealing ring AT in this case comprises a contact 7 forming a wall and a first metal track PST that is situated at a first metallization level M1 of an interconnect portion (known to those skilled in the art by the acronym BEOL for back end of line) of the integrated circuit CI.

On this same metal track PST that is situated at the first metallization level M1, there rests a via wall 9 surmounted by a second metal track PST that is situated at the second metallization level.

The sealing ring AT bears on a first polysilicon bar 5, which is itself on a first dielectric layer 20, for example a silicon oxide layer or an oxide-nitride-oxide layer.

The dielectric layer 20 separates the first polysilicon bar 5 from a second polysilicon bar 3 that is itself separated from the semiconductor substrate S by a second dielectric layer 30, for example a silicon oxide layer or an oxide-nitride-oxide layer.

This stack of polysilicon bars and of oxide layers crosses the contact wall 7 and extends to the periphery of the integrated circuit CI.

This crossing portion TRA constitutes a portion of an electrically conductive connecting element LI that therefore extends to the outside of the integrated circuit CI.

The electrically conductive connecting element LI extends between a first location E1 inside the integrated circuit CI and a second location E2 situated outside the integrated circuit CI, in this case a location of the substrate that is situated in zone E2 of the wafer beyond the cutting line LD.

The connecting element LI also comprises a straddling portion PST2 that will straddle said cutting line LD. The straddling portion is located at the first metallization level M1.

Of course, it would be possible for it to extend to a higher metallization level.

The straddling portion PST2 is connected to the second location E2 by a contact 73 that is positioned on a first metal silicide layer 81. The straddling portion PST2 is connected to the second polycrystalline silicon bar 3 by the contact 72 that is positioned on a second metal silicide layer 82.

The first location E1 is connected to an electrically conductive body PC by a via 71 resting on a third metal silicide layer 83. The body PC is in this case situated at the metallization level M1, but it could advantageously be situated at a higher metallization level.

The electrically conductive body PC is coupled to said variable resistor RV by the via or the control terminal V1.

The electrically conductive body PC may comprise an electrically conductive wafer.

The second location E2 thus connected to the substrate S by the first metal silicide layer 81 makes it possible, if the substrate S is kept grounded, to keep the first location E1 and therefore the electrically conductive body PC grounded.

Specifically, this is particularly advantageous for shedding electric charge that might accumulate on the wafer PC during the production of the integrated circuit.

The straddling portion PST2 of the connecting element LI will subsequently be cut through, thus conferring an uncharged state on said body PC. The body PC becomes an electrically conductive body at floating potential, in this case having an electrically zero initial amount of charge.

The example of a connecting element passing through the sealing ring is particularly advantageous as this makes it possible to keep the conductive body PC grounded while at the same time protecting the integrated circuit from the intrusion of interfering external elements.

That being said, other means are possible for keeping the body grounded during the production of the integrated circuit and then making it floating thereafter.

For example, when the integrated circuit is produced, it is possible to connect to said body PC to the substrate S, which is kept grounded, using metal lines. Then, after producing the integrated circuit, an orifice is produced above the metal lines that is cut through using a laser.

Figure 3:
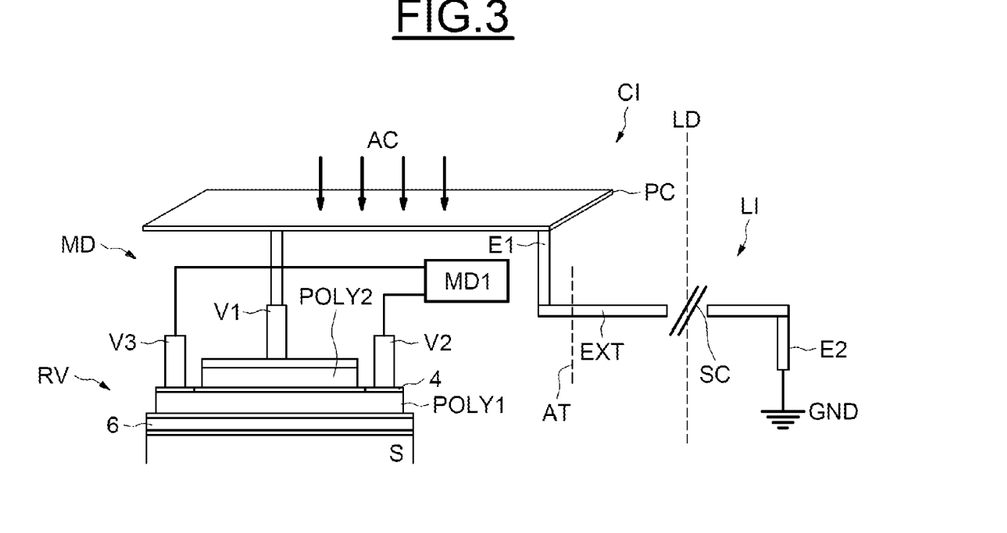
FIG. 3 is a simplified depiction of said integrated circuit.

FIG. 3 is a simplified depiction of said integrated circuit CI after cutting through SC the straddling portion PST2.

With the straddling portion PST2 having been cut through, the connecting element LI now comprises a free end EXT that is situated outside said sealing ring AT.

The term "free end" is understood to mean that there is no longer any contact between the integrated circuit CI and an external element.

The integrated circuit CI therefore comprises said electrically conductive body at floating potential PC coupled to said variable resistor RV by the control terminal V1.

The integrated circuit CI comprises a detection circuit MD configured so as to detect an amount of electric charge AC on the body PC that is different from an initial amount of charge, which is zero in this case since the body PC was grounded during the production of the integrated circuit.

The detection circuit MD comprises the variable resistor RV as well as a detection block MD1 that is configured so as to detect the amount of electric charge AC on said body PC by making a measurement using the variable resistor RV.

The detection block MD1 is connected in this example to the terminals of V2 and V3 of the first polycrystalline silicon layer POLY1 in order to measure a physical variable linked to the resistance of said variable resistor RV when said voltage V0 is applied by said control terminal V1.

As the control terminal V1 is connected to said electrically conductive body PC, said voltage V0 is only able to originate from an amount of charge AC transferred to said electrically conductive body PC. Thus, detecting an attack comprising the use of focused electron beams (Ebeam) of the use of ion beams (FIB for focused ion beam) comprises detecting the accumulation of electric charge AC on said electrically conductive body at floating potential PC.

The detection of the accumulation of charge AC is performed, as mentioned above, by measuring a physical variable linked to the resistance of said variable resistor RV.

"Physical variable" is understood to mean the measurement, at the terminals V2 and V3, of the resistance of the first polycrystalline silicon layer POLY1 or of the voltage at the second polycrystalline silicon layer POLY2.

Figure 4:
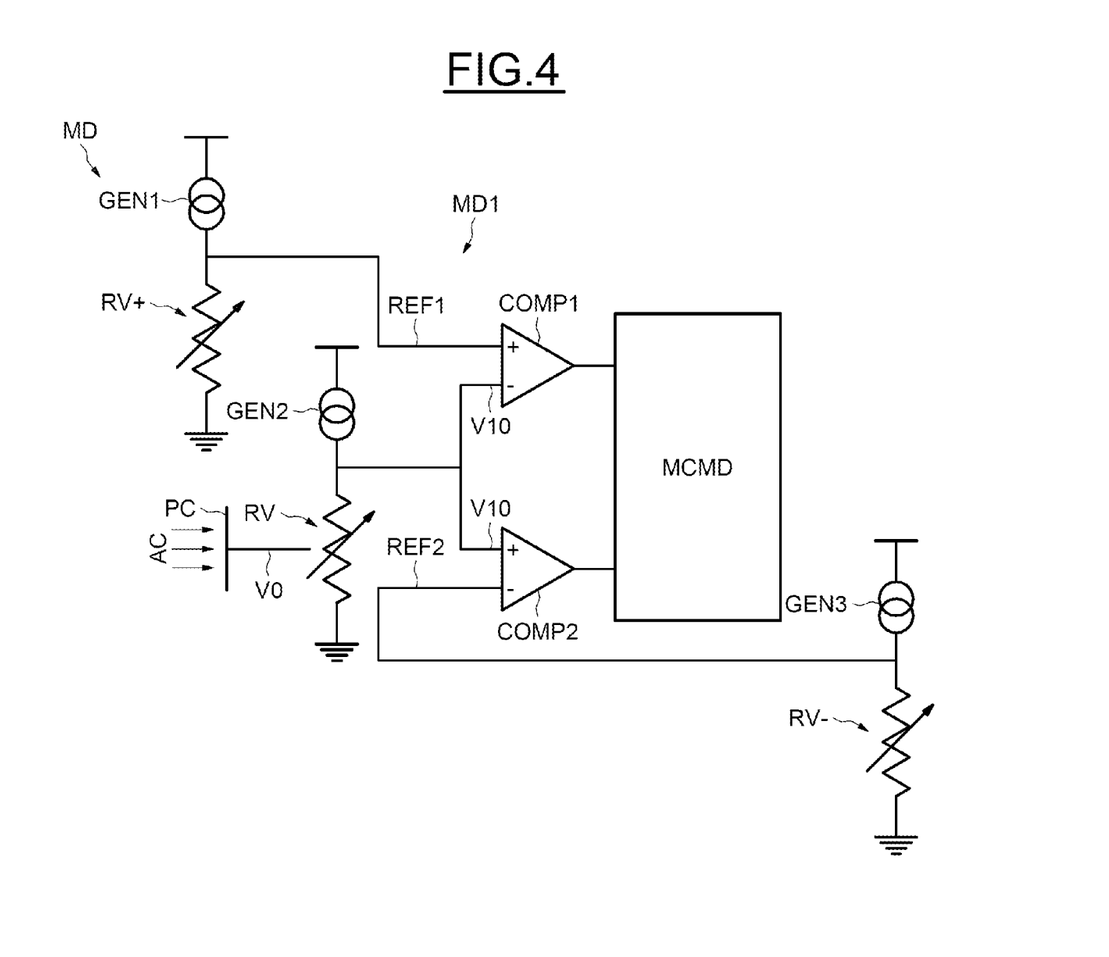
FIG. 4 schematically illustrates a detection circuit.

FIG. 4 schematically illustrates the detection circuit MD, and more precisely one example of a circuit for performing the measurement of said physical variable.

In this example, said wafer PC produces the voltage V0 across the terminals of the variable resistor RV. The detection block MD1 includes a constant current generator GEN2 that generates a current through the variable resistor RV, producing a voltage V10 across the terminals of this resistor.

The detection block MD1 also comprises a first comparator COMP1 and a second comparator COMP2 that are configured so as to compare the voltage V10 with two reference voltages REF1 and REF2.

In this respect, the voltage V10 is sent on a first input (−) of the first comparator COMP1 and also sent on a first input (+) of the second comparator COMP2.

The second input (+) of the first comparator COMP1 is configured so as to receive the voltage REF1.

The value RV0 of the resistor RV before any attack, that is to say in the absence of charge AC, is known.

The reference voltage REF1 is the voltage across the terminals of a first reference resistor RV+ having a resistance for example 10% higher than the value RV0 when this resistor RV+ is flowed through by a current generated by a generator GEN1 that is coupled to said resistor RV+.

The second input (−) of the second comparator COMP2 is configured so as to receive the voltage REF2. The reference voltage REF2 is the voltage across the terminals of a second reference resistor RV− having a resistance for example 10% lower than the value RV0 when this resistor RV− is flowed through by a current generated by a generator GEN3 that is coupled to said resistor RV−.

It should be noted that the three generators GEN1, GEN2 and GEN3 produce a current having one and the same magnitude.

For example, for a current having a magnitude of between 1 and 10 μA, the value RV0 is between 50 kOhm ohm and 500 kOhm, to which 10% is added in order to obtain the resistance of the resistor RV+ and from which 10% is subtracted in order to obtain the resistance of the resistor RV−.

If the voltage V10 is greater than the first reference voltage REF1, the comparator COMP1 is configured so as to deliver, for example, a "1", and if not a "0" to control circuit MCMD.

If the voltage V10 is lower than the second reference voltage REF2, the comparator COMP2 is configured so as to deliver, for example, a "1", and if not a "0" to the control circuit MCMD.

Thus, if the voltage V10 is outside the interval between REF2 and REF1, an alarm signal will be generated, thereby allowing the control circuit MCMD, for example, to trigger an action for protecting the integrated circuit, for example resetting with blocking of the operation.

The generation of such a protective action is only an example, of course. Other protective actions may very well be implemented.

Figure 5:
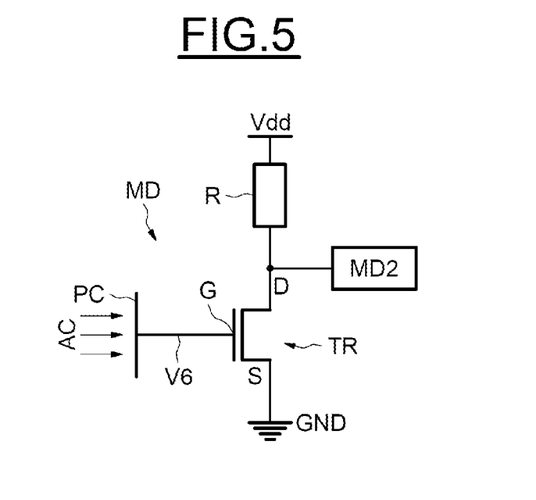
FIG. 5 schematically illustrates a variant where the variable resistor is replaced with an NMOS transistor.

FIG. 5 schematically illustrates one variant of an embodiment.

The variable resistor RV is replaced with an NMOS transistor TR whose gate (control electrode) G is coupled to the body PC by a via V6.

The drain D of said transistor TR is coupled to a resistor R, which is itself coupled to the supply voltage Vdd. With regard to the source of the transistor TR, this is connected to ground.

Before any attack, the gate-source voltage of the transistor is less than the threshold voltage of the transistor TR. The transistor TR is in the off state and a detection block MD2 does not detect anything.

If the attacker uses a positive ion beam, for example, the voltage on the gate of the transistor increases and the gate-source voltage becomes greater than the threshold voltage of the transistor. The transistor TR changes to the on state. A drain current then flows and is detected by the detection block MD2, which in this case detects the on state of the transistor TR.

Figure 6A:
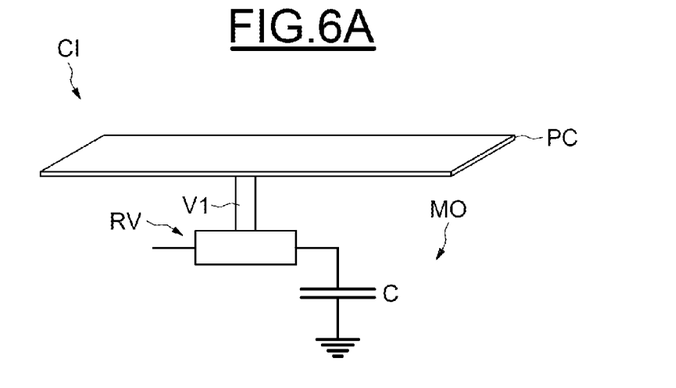
FIG. 6A schematically illustrates an embodiment of an integrated circuit for performing a countermeasure.
Figure 6B:
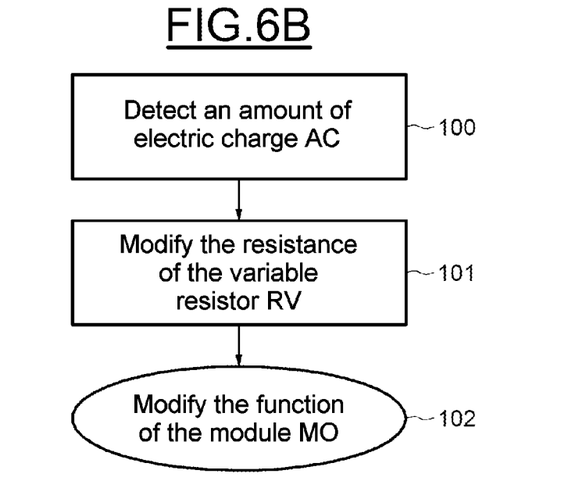
FIG. 6B illustrates one mode of implementation of this countermeasure.

FIG. 6A schematically illustrates one embodiment, more precisely one example of an integrated circuit for performing a countermeasure. FIG. 6B illustrates one mode of implementation of this countermeasure.

The integrated circuit CI in this example comprises the electrically conductive body PC at floating potential and a module MO comprising said variable resistor RV and a capacitor C thus performing a filter function.

Said variable resistor RV, as illustrated above, comprises said control terminal V1 that is electrically coupled to said body PC. Thus, when a voltage V0 is applied to said control terminal V1, resulting from the detection of electric charge AC (step 100—FIG. 6B), the resistance of the variable resistor RV is modified (step 101—FIG. 6B), thus modifying (step 102—FIG. 6B) the cut-off frequency of said filter contained in the module MO.

Said modification of the cut-off frequency thus modifies the function of said module MO, this corresponding to the performance of a countermeasure that counteracts the attack performed on the integrated circuit.

The function of the module MO may also be modified using the transistor TR. This transistor TR may be connected for example in parallel across a component of this module. Therefore, in the off state, the transistor TR does not have an influence on this component, whereas it short-circuits said component in its on state.

Figure 7:
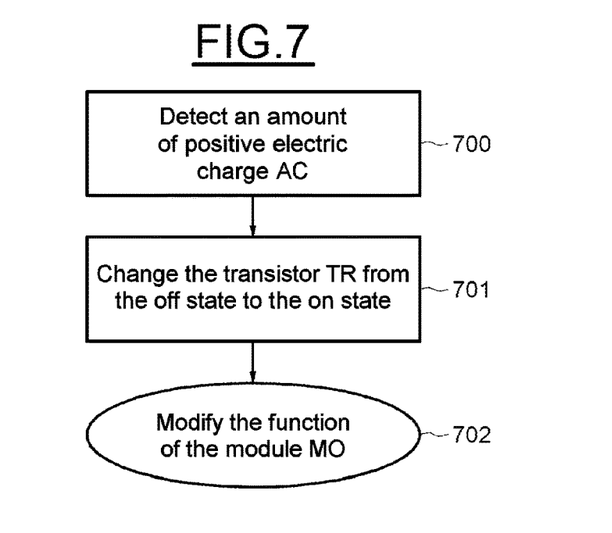
FIG. 7 illustrates a method modifying a function of the module.

More precisely, as illustrated in FIG. 7, when said voltage V0 is applied to said control electrode (gate) (step 700), the transistor TR changes from the off state to the on state (step 701), short-circuiting the component. This leads to a modification of the function of said module MO (step 702), and therefore to a countermeasure being performed.

Figure 8:
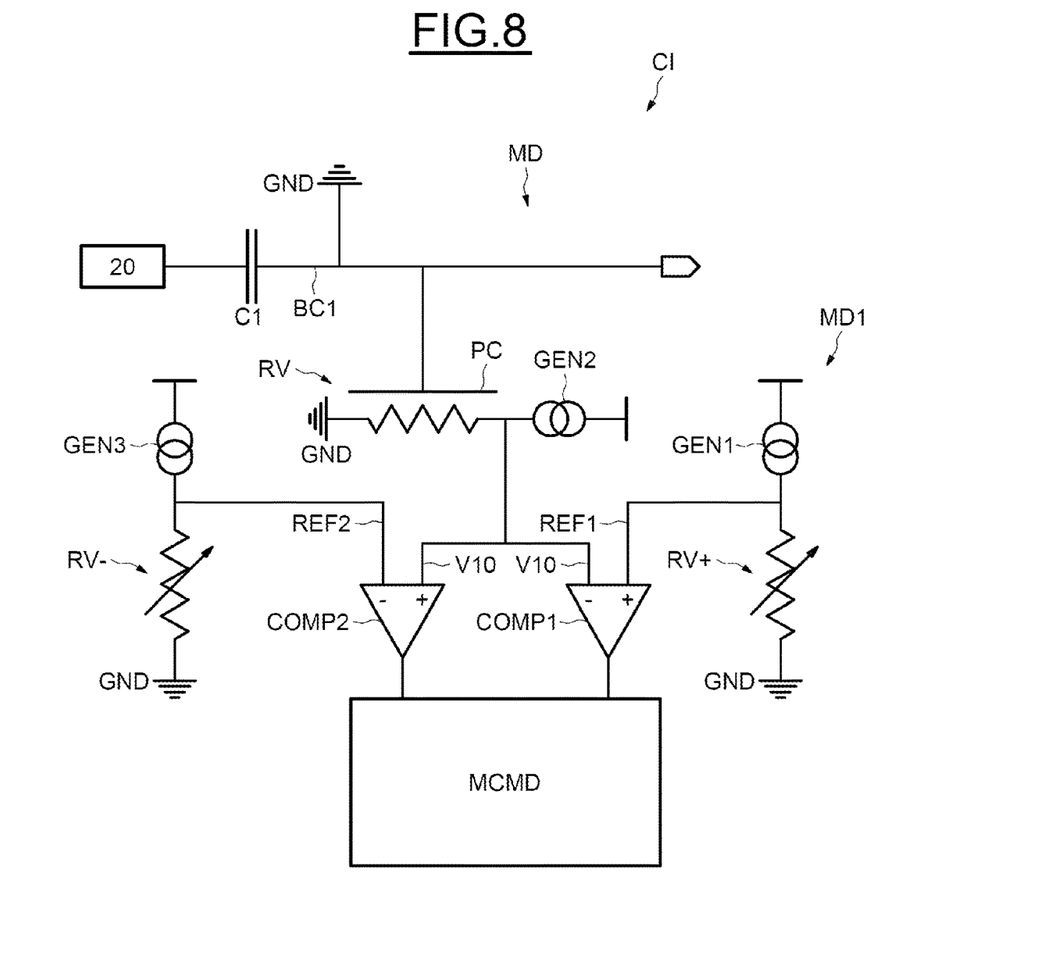
FIG. 8 schematically illustrates an example of a circuit for detecting the grounding of the body in an attack.

FIG. 8 schematically illustrates one example of a circuit for detecting the grounding GND of the body PC in an attack.

The integrated circuit CI comprises a capacitor C1, a first terminal BC1 of which is electrically coupled to said body PC. A second terminal of the capacitor C1 is coupled to a circuit 20 that is configured so as to increase the voltage across the terminals of the capacitor C1.

If an attacker grounds the electrically conductive body at floating potential PC in order to no longer send charge to the variable resistor RV and prevent the detection block MD1, described above, from detecting a variation in the resistance of the variable resistor RV, the voltage at the terminal BC1 is not able to increase when the circuit 20 increases the voltage, and therefore remains zero.

The detection block MD1 configured so as to measure the voltage V10 across the terminals of the variable resistor RV then measures a voltage lower than the reference voltage REF2, signifying that the attacker has grounded the electrically conductive body PC.

In this case, an alarm signal may also be generated by the control circuit MCMD, thereby making it possible for example to trigger a protective action in this case as well.

The invention claimed is:

1. An apparatus, comprising:
a semiconductor wafer including a first zone and a second zone with a cutting path passing between the first zone and the second zone;
an electrically conductive body;
a detection circuit configured to detect an amount of electric charge collected on said electrically conductive body as a result of an attack;
a control circuit configured to trigger a protective action in response to the detected amount of electric charge; and
an electrically conductive connecting element positioned with the cutting path passing through the electrically conductive connecting element, said electrically conductive connecting element having a first end that is electrically connected to said electrically conductive body in the first zone and a second end located in the second zone;
wherein the second end of the electrically conductive connecting element is directly electrically connected to the semiconductor wafer in the second zone.

2. An apparatus, comprising:
a semiconductor wafer including a first zone and a second zone with a cutting path passing between the first zone and the second zone;
an electrically conductive body;
a detection circuit configured to detect an amount of electric charge collected on said electrically conductive body as a result of an attack;
a control circuit configured to trigger a protective action in response to the detected amount of electric charge;
an electrically conductive connecting element positioned with the cutting path passing through the electrically conductive connecting element, said electrically conductive connecting element having a first end that is electrically connected to said electrically conductive body in the first zone and a second end located in the second zone; and
a shallow trench isolation in the semiconductor wafer positioned with the cutting path passing through the shallow trench isolation.

3. The apparatus of claim 2, further comprising an opening in the shallow trench isolation in the second zone, and wherein the second end of the electrically conductive connecting element is electrically connected to the semiconductor wafer at said opening.

4. The apparatus of claim 3, further comprising a silicide layer at an upper surface of the semiconductor wafer at said opening.

5. The apparatus of claim 1, wherein the direct electrical connection of the second end of the electrically conductive connecting element applies an initial amount of electric charge on the electrically conductive body prior to said attack.

6. The apparatus of claim 5, wherein the initial amount of electric charge is a zero amount.

7. An apparatus, comprising:
a semiconductor wafer including a first zone and a second zone with a cutting path passing between the first zone and the second zone;
an electrically conductive body;
a detection circuit configured to detect an amount of electric charge collected on said electrically conductive body as a result of an attack;
a control circuit configured to trigger a protective action in response to the detected amount of electric charge;
an electrically conductive connecting element positioned with the cutting path passing through the electrically conductive connecting element, said electrically conductive connecting element having a first end that is electrically connected to said electrically conductive body in the first zone and a second end located in the second zone; and
at least one sealing ring in the first zone positioned between the electrically conductive body and the cutting path.

8. The apparatus of claim 7, wherein a portion of the electrically conductive connecting element passes through said at least one sealing ring.

9. An apparatus, comprising:
a semiconductor wafer including a first zone and a second zone with a cutting path passing between the first zone and the second zone;
an electrically conductive body;
a detection circuit configured to detect an amount of electric charge collected on said electrically conductive body as a result of an attack;
a control circuit configured to trigger a protective action in response to the detected amount of electric charge; and
an electrically conductive connecting element positioned with the cutting path passing through the electrically conductive connecting element, said electrically conductive connecting element having a first end that is electrically connected to said electrically conductive body in the first zone and a second end located in the second zone;
wherein the detection circuit comprises:
a variable resistor having a control terminal that is electrically coupled to said electrically conductive body, said resistor configured to have a resistance that is modified according to a voltage applied to said control terminal in response to the collected amount of electric charge, and
a detection block configured to detect a physical variable linked to the resistance of the variable resistor.

10. The apparatus of claim 9, wherein the control circuit is configured to trigger the protective action if a value of the physical variable linked to the resistance of the variable resistor lies outside of a range of reference values.

11. The apparatus of claim 1, wherein the detection circuit comprises:

a transistor having a control electrode that is electrically coupled to said electrically conductive body, said transistor configured to be in an off state when said initial amount of charge is present and to be in an on state in response to a voltage induced by collected amount of electric charge; and wherein the detection circuit is configured to detect said on state of the transistor.

12. An apparatus, comprising:
a semiconductor wafer including a first zone and a second zone with a cutting path passing between the first zone and the second zone;
an electrically conductive body;
a detection circuit configured to detect an amount of electric charge collected on said electrically conductive body as a result of an attack;
a control circuit configured to trigger a protective action in response to the detected amount of electric charge;
an electrically conductive connecting element positioned with the cutting path passing through the electrically conductive connecting element, said electrically conductive connecting element having a first end that is electrically connected to said electrically conductive body in the first zone and a second end located in the second zone; and
a module including a variable resistor having a control terminal that is electrically coupled to said electrically conductive body, wherein the detection circuit is configured to apply a voltage to said control terminal according to the amount of charge present on said electrically conductive body, and wherein the control circuit is configured to trigger the protective action by modifying a function of said module.

13. The apparatus of claim 1, further comprising a module including a transistor having a control electrode that is electrically coupled to said electrically conductive body, wherein the detection circuit is configured to apply a voltage to said control electrode in response to the collected amount of electric charge so as to put the transistor into an on state, and wherein the control circuit is configured to trigger the protective action by modifying a function of said module resulting from the changing of the transistor to its on state.

14. The apparatus of claim 1, further comprising a capacitor having a terminal that is electrically coupled to said electrically conductive body, and wherein the detection circuit is configured to detect a grounding of said electrically conductive body by performing a measurement, at said terminal, of a physical variable whose value lies outside of a range of reference values.

15. The apparatus of claim 1, wherein the electrically conductive body comprises an electrically conductive wafer.

16. A method for producing an integrated circuit, comprising:
delimiting a semiconductor wafer to include a first zone and a second zone;
forming an attack detection circuit at the first zone, said attack detection circuit including an electrically conductive body configured to collecting electric charge as a result of an attack, a detection circuit configured to detect an amount of electric charge collected on said electrically conductive body, and a control circuit configured to trigger a protective action in response to the detected amount of electric charge;
forming an electrically conductive connecting element positioned passing from the first zone to the second zone, said electrically conductive connecting element having a first end that is electrically connected to said electrically conductive body in the first zone and a second end located in the second zone;
electrically coupling the second end of electrically conductive connecting element to apply an initial amount of electric charge on the electrically conductive body prior to said attack, wherein electrically coupling comprises directly electrically connecting the second end to the semiconductor wafer in the second zone; and
then severing the electrically conductive connecting element through a cutting path extending between the first zone and the second zone.

17. The method of claim 16, wherein electrically coupling comprises grounding said electrically conductive body via the electrically conductive connecting element during the production of the integrated circuit.

* * * * *